United States Patent
Manabe et al.

(10) Patent No.: US 8,034,498 B2
(45) Date of Patent: Oct. 11, 2011

(54) FUEL CELL SYSTEM

(75) Inventors: Kota Manabe, Toyota (JP); Mikio Kizaki, Toyoake (JP); Nobuyuki Orihashi, Toyota (JP); Shigetaka Hamada, Toyota (JP); Masahiro Shige, Kaizuka (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 854 days.

(21) Appl. No.: 11/922,874

(22) PCT Filed: Jun. 30, 2006

(86) PCT No.: PCT/JP2006/313531
§ 371 (c)(1),
(2), (4) Date: Dec. 26, 2007

(87) PCT Pub. No.: WO2007/004717
PCT Pub. Date: Jan. 11, 2007

(65) Prior Publication Data
US 2009/0169934 A1 Jul. 2, 2009

(30) Foreign Application Priority Data
Jun. 30, 2005 (JP) .................................. 2005-191377

(51) Int. Cl.
*H01M 8/04* (2006.01)
(52) U.S. Cl. ........................................ 429/430; 429/433
(58) Field of Classification Search .................. 429/428, 429/433, 430, 431, 432
See application file for complete search history.

(56) References Cited

U.S. PATENT DOCUMENTS

| 2004/0151956 | A1 | 8/2004 | Orihashi et al. | |
| 2004/0229098 | A1* | 11/2004 | Fujita | 429/25 |
| 2005/0048336 | A1* | 3/2005 | Takebe et al. | 429/22 |
| 2006/0147765 | A1* | 7/2006 | Barrett | 429/13 |

FOREIGN PATENT DOCUMENTS

| EP | 1 501 146 A2 | 1/2005 |
| JP | 2002-367650 A | 12/2002 |
| JP | 2003-86220 A | 3/2003 |
| JP | 2004-509446 A | 3/2004 |
| JP | 2004-119139 A | 4/2004 |
| JP | 2004-241236 A | 8/2004 |
| JP | 2005-108674 A | 4/2005 |
| JP | 2005-285614 A | 10/2005 |
| WO | WO 03/098769 A2 | 11/2003 |

* cited by examiner

*Primary Examiner* — Jennifer Michener
*Assistant Examiner* — Monique Wills
(74) *Attorney, Agent, or Firm* — Kenyon & Kenyon LLP

(57) ABSTRACT

A fuel cell system according to the present invention is characterized by comprising a fuel cell, measurement means for measuring impedances of the fuel cell in two kinds or more of frequency regions, and first judgment means for judging two or more parameters concerned with an internal state of the fuel cell based on measurement results of the impedances in the respective frequency regions. According to such a constitution, the impedances in the two or more types of frequency regions (a high frequency region, a low frequency region and the like) are measured to judge two or more parameters such as a wet state of an electrolytic film of the fuel cell and a supply state of a fuel gas, which are concerned with the internal state of the fuel cell based on this measurement result. Since such judgment is performed, as compared with the conventional technology, the internal state of the fuel cell can accurately be grasped, and highly efficient and highly robust control of the fuel cell system can be performed.

7 Claims, 4 Drawing Sheets

FIG.4

|  | HIGH FREQUENCY IMPEDANCE SMALL | HIGH FREQUENCY IMPEDANCE LARGE |
|---|---|---|
| LOW FREQUENCY IMPEDANCE SMALL | STATE A | STATE C |
| LOW FREQUENCY IMPEDANCE LARGE | STATE B | STATE D |

FIG.5

|  | WATER CONTENT BALANCE MONITOR EXCESSIVE | WATER CONTENT BALANCE MONITOR NORMAL |
|---|---|---|
| FUEL GAS PURITY MONITOR LOW | STATE E | STATE G |
| FUEL GAS PURITY MONITOR HIGH | STATE F | STATE H |

FUEL CELL SYSTEM

This is a 371 national phase application of PCT/JP2006/313531 filed 30 Jun. 2006, claiming priority to Japanese Patent Application No. 2005-191377 filed 30 Jun. 2005, the contents of which are incorporated herein by reference.

TECHNICAL FIELD

The present invention relates to a fuel cell system. More particularly, it relates to a fuel cell system which measures an impedance by use of an alternating-current impedance process.

BACKGROUND ART

It is known that an internal resistance of a fuel cell influences wettability of an electrolytic film in the fuel cell. When the fuel cell has a small internal water content and the electrolytic film dries (so-called dry-up), the internal resistance increases, and an output voltage of the fuel cell drops. On the other hand, when the fuel cell includes an excessively large internal water content (so-called flooding), electrodes of the fuel cell are covered with the water content, hence dispersion of oxygen or hydrogen as a reactant is disturbed, and the output voltage drops.

To efficiently operate the fuel cell, optimum control of the internal water content of the fuel cell needs to be performed. The internal water content of the fuel cell has correlation with an impedance of the fuel cell. At present, the impedance of the fuel cell is measured by an alternating-current impedance process, and a water content state in the fuel cell is indirectly grasped.

For example, in the following patent document 1, a method is disclosed in which a sinusoidal signal (a signal for impedance measurement) having an arbitrary frequency is applied to (superimposed on) an output signal of the fuel cell, and the impedance in this case is measured to grasp the water content state in the fuel cell in real time.

[Patent Document 1] Japanese Patent Application Laid-Open No. 2003-86220

DISCLOSURE OF THE INVENTION

Incidentally, to carry out a stable operation of a fuel cell, in addition to a water content state in the fuel cell, other parameters (a supply state of a fuel gas or an oxidizing gas, etc.) need to be grasped to generally judge an internal state of the fuel cell.

However, in the above-mentioned conventional technology, since the only water content state in the fuel cell is grasped using the measured impedance, abnormalities (dry-up and flooding) of the water content state in the fuel cell can be detected, but abnormalities of the other parameters cannot be detected, and there has been a problem that the internal state of the fuel cell cannot accurately be judged.

The present invention has been developed in view of the above-mentioned situation, and an object thereof is to provide a fuel cell system in which an internal state of a fuel cell can accurately be grasped.

To solve the above-mentioned problem, a fuel cell system according to the present invention comprises: a fuel cell; measurement means for measuring impedances of the fuel cell in two kinds or more of frequency regions; and first judgment means for judging two or more parameters concerned with an internal state of the fuel cell based on measurement results of the impedances in the respective frequency regions.

According to such a constitution, the impedances in two kinds or more of frequency regions (a high frequency region, a low frequency region, etc.) are measured, and two or more parameters such as a wet state of an electrolytic film of the fuel cell and a supply state of a fuel gas, which are concerned with the internal state of the fuel cell, are judged based on this measurement result. Since such judgment is performed, as compared with the conventional technology, the internal state of the fuel cell can accurately be grasped, and highly efficient and highly robust control of the fuel cell system can be achieved.

Here, it is preferable in the above-mentioned constitution that the two or more types of frequency regions are two or more types of frequency regions including a low frequency region (a first frequency region) and a high frequency region (a second frequency region having a frequency higher than that of the first frequency region) and that the two or more parameters include a supply state of a fuel gas with respect to the fuel cell and a wet state of an electrolytic film of the fuel cell.

Moreover, it is preferable that the measurement means measures the impedance in the low frequency region and the impedance in the high frequency region and that the first judgment means judges the supply state of the fuel gas with respect to the fuel cell and the wet state of the electrolytic film of the fuel cell based on a combination of the measurement result of the impedance in the low frequency region and the measurement result of the impedance in the high frequency region.

Furthermore, it is preferable that in the first judgment means, a first impedance threshold value to judge whether the supply state of the fuel gas is satisfactory or defective and a second impedance threshold value to judge whether the wet state of the electrolytic film is satisfactory or defective are set, the first judgment means judges that the supply state of the fuel gas is defective in a case where the measurement result of the impedance in the low frequency region is larger than the first impedance threshold value, and the first judgment means judges that the wet state of the electrolytic film is defective in a case where the measurement result of the impedance in the high frequency region is larger than the second impedance threshold value.

In addition, it is preferable that the system further comprises: first detection means for detecting a water content state in the fuel cell; second detection means for detecting a fuel gas purity in the fuel cell; and second judgment means which judges a factor for a defect based on detection results of the respective detection means in a case where the first judgment means judges that the supply state of the fuel gas is defective.

Moreover, it is preferable that the second judgment means judges based on a combination of the detection results of the respective detection means whether the factor for the defect is a supply abnormality of the fuel gas, a supply abnormality of an oxidizing gas or a fuel reaching abnormality due to flooding.

In addition, it is preferable that the first detection means detects whether the water content state is normal or excessive, the second detection means detects whether the fuel gas purity is low or high, the second judgment means judges that the factor for the defect is the fuel reaching abnormality due to the flooding in a case where the first detection means judges that the water content state is excessive, the second judgment means judges that the factor for the defect is the supply abnormality of the fuel gas in a case where the second detection means judges that the fuel gas purity is low, and the second judgment means judges that the factor for the defect is the supply abnormality of the oxidizing gas in a case where the second detection means judges that the fuel gas purity is high.

Moreover, it is preferable that the system further comprises: oxidizing gas supply control means for increasing an amount of the oxidizing gas to be supplied to eliminate the defect in a case where the second judgment means judges that the factor for the defect is the supply abnormality of the oxidizing gas. It is also preferable that the system further comprises: fuel gas supply control means for increasing an amount of the fuel gas to be supplied to eliminate the defect in a case where the second judgment means judges that the factor for the defect is the supply abnormality of the fuel gas.

Furthermore, it is preferable that the system further comprises: water content balance control means for increasing an amount of water to be carried away by an exhaust gas from the fuel cell in a case where the second judgment means judges that the factor for the defect is the fuel reaching abnormality due to the flooding.

As described above, according to the present invention, the internal state of the fuel cell can accurately be grasped.

BRIEF DESCRIPTION OF THE DRAWINGS

FIG. 4 is an explanatory view for judging an outline of an internal state of the fuel cell according to the embodiment; and FIG. 5 is an explanatory view for judging details of the internal state of the fuel cell according to the embodiment.

BEST MODE FOR CARRYING OUT THE INVENTION

An embodiment of the present invention will hereinafter be described with reference to the drawings.

A. Present Embodiment

A-1. Whole Constitution

Figure 1:
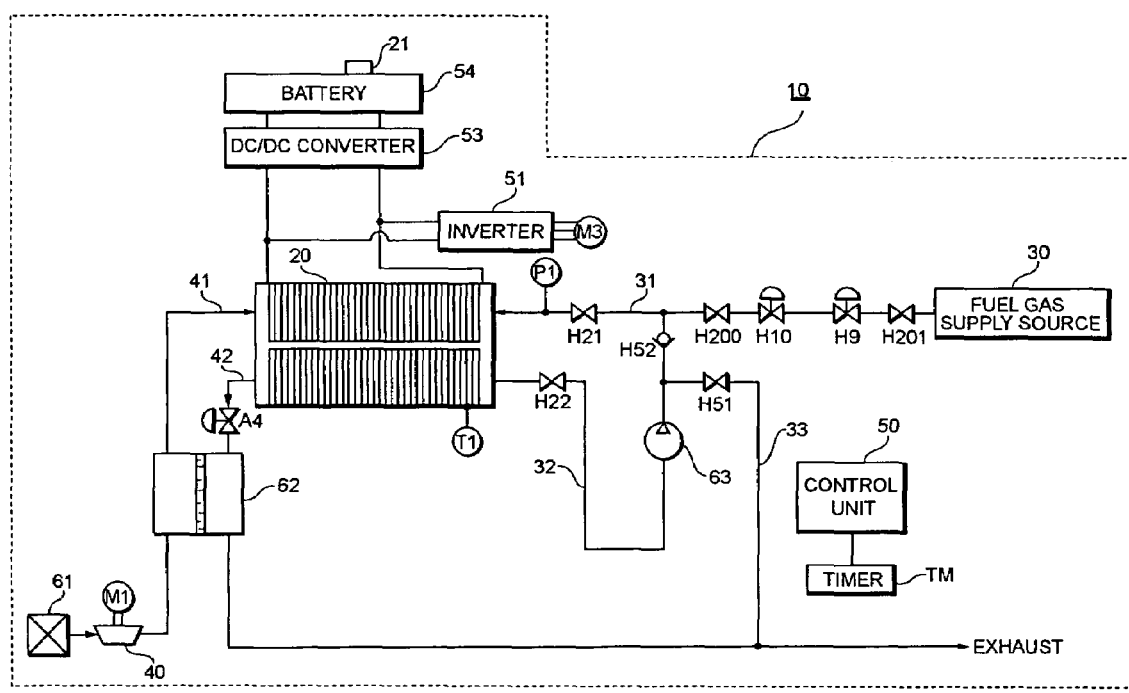
FIG. 1 is a diagram showing a constitution of a fuel cell system according to the present embodiment.

FIG. 1 is a schematic constitution diagram of a vehicle on which a fuel cell system 10 according to the present embodiment is mounted. It is to be noted that in the following description, a fuel cell hybrid vehicle (FCHV) is assumed as one example of a vehicle, but the present embodiment is also applicable to an electric car and a hybrid car. The embodiment is applicable to not only the vehicle but also various mobile bodies (e.g., a boat, an airplane, etc.).

A fuel cell (a cell stack) 20 is means for generating a load driving power from supplied fuel and oxidizing gases, and has a stacked structure in which a plurality of single cells are laminated in series.

The fuel cell system 10 includes a fuel gas circulation supply system and an oxidizing gas supply system connected to the fuel cell 20. The fuel gas circulation supply system of the fuel cell 20 includes a fuel gas supply source 30, a fuel gas supply path 31, the fuel cell 20, a fuel gas circulation path 32 and an anode off gas channel 33.

The fuel gas supply source 30 is constituted of a hydrogen storage source such as a high pressure hydrogen tank or a hydrogen storage tank. The fuel gas supply path 31 is a gas channel for guiding a fuel gas supplied from the fuel gas supply source 30 to an anode pole of the fuel cell 20, and the gas channel is provided with a tank valve H201, a high pressure regulator H9, a low pressure regulator H10, a hydrogen supply valve H200 and an FC inlet valve H21 in order from an upstream side to a downstream side. A pressure of the fuel gas compressed to a high pressure is reduced to an intermediate pressure in the high pressure regulator H9, and further reduced to a low pressure (a usual operation pressure) in the low pressure regulator H10. The fuel gas having the pressure thereof reduced is supplied to the fuel cell 20 via the FC inlet valve H21. The pressure of the fuel gas supplied to the fuel cell 20 is detected by a pressure sensor P1.

The fuel gas circulation path 32 is a reflow gas channel for allowing an unreacted fuel gas to reflow to the fuel cell 20, and the gas channel is provided with an FC outlet valve H22, a hydrogen pump (a fuel pump) 63 and a check valve H52 in order from the upstream side to the downstream side. The hydrogen pump 63 is means for controlling a flow rate of the unreacted fuel gas discharged from the fuel cell 20, and appropriately pressurizes the unreacted fuel gas discharged from the fuel cell 20 to supply the gas to the fuel gas supply path 31. The check valve H52 inhibits counter flow of the fuel gas from the fuel gas supply path 31 to the fuel gas circulation path 32. The anode off gas channel 33 is a gas channel for discharging a hydrogen off gas discharged from the fuel cell 20 to the outside of the system, and the gas channel is provided with a purge valve H51.

The tank valve H201, the hydrogen supply valve H200, the FC inlet valve H21, the FC outlet valve H22 and the purge valve H51 described above are shut valves for controlling an amount of the fuel gas to be supplied or discharged to the gas channels 31 to 33 or the fuel cell 20 under control of a control unit 50 described later, and are constituted of, for example, electromagnetic valves. As such an electronic valve, for example, an on/off-valve, a linear valve in which a valve open degree can linearly be regulated under PWM control or the like is preferable.

The oxidizing gas supply system of the fuel cell 20 includes an air compressor 40, an oxidizing gas supply path 41 and a cathode off gas channel 42. The air compressor 40 compresses air captured from outside air via an air filter 61, and supplies the compressed air as the oxidizing gas to a cathode pole of the fuel cell 20. The oxidizing off gas subjected to a battery reaction of the fuel cell 20 flows through the cathode off gas channel 42, and is discharged from the system. The oxidizing off gas contains water produced by the battery reaction in the fuel cell 20, and therefore has a highly wet state.

A humidification module 62 performs water content exchange between a lowly wet oxidizing gas flowing through the oxidizing gas supply path 41 and a highly wet oxygen off gas flowing through the cathode off gas channel 42 to appropriately humidify the oxidizing gas to be supplied to the fuel cell 20. A back pressure of the oxidizing gas to be supplied to the fuel cell 20 is regulated by a pressure regulation valve A4 disposed around a cathode outlet of the cathode off gas channel 42. It is to be noted that a flow rate of an oxygen off gas discharged from the system via the cathode off gas channel 42 is controlled by the air compressor 40.

A battery (an accumulator) 54 is a chargeable/dischargeable secondary battery constituted of, for example, a nickel hydrogen battery. Various other types of secondary batteries are applicable. Instead of the battery 54, a chargeable/dischargeable accumulator other than the secondary battery, for example, a capacitor may be used. This battery 54 is inserted in a discharge path of the fuel cell 20, and connected in parallel with the fuel cell 20.

A DC/DC converter (a voltage conversion device) 53 is disposed between the battery 54 and an inverter 51. The DC/DC converter 53 is a direct-current voltage converter, and has a function of regulating a DC voltage input from the battery 54 to output the voltage to a fuel cell 20 side, and a function of regulating the DC voltage input from the fuel cell 20 or a synchronous motor M3 to output the voltage to a battery 54 side. The functions of the DC/DC converter 53 realize charging/discharging of the battery 54.

A vehicle auxiliary machine (e.g., an illumination device, an air conditioning device, etc. not shown) and an FC auxiliary machine (e.g., a pump for supplying the fuel gas or a reforming material, etc. not shown) are connected between the battery 20 and the DC/DC converter 53, and the battery 20 is a power source of these auxiliary machines.

Operations of the above-mentioned elements are controlled by the control unit 50. The control unit 50 is constituted as a microcomputer including therein a CPU, an RAM and an ROM. The control unit 50 controls switching of the inverter 51, and outputs a three-phase alternating current to the synchronous motor M3 based on a required power. The control unit 50 controls operations of the fuel cell 20 and the DC/DC converter 53 so as to supply the power corresponding to the required power. Various sensor signals are input into this control unit 50. For example, from the pressure sensor P1 which detects the pressure of the fuel gas to be supplied to the fuel cell 20, a temperature sensor T1 which detects a temperature of the fuel cell 20, an SOC sensor 21 which detects a state of charge (SOC) of the battery 20, a timer TM for timing and the like, various sensor signals are input into the control unit 10.

A-2. Description of Impedance Measurement

Figure 2:
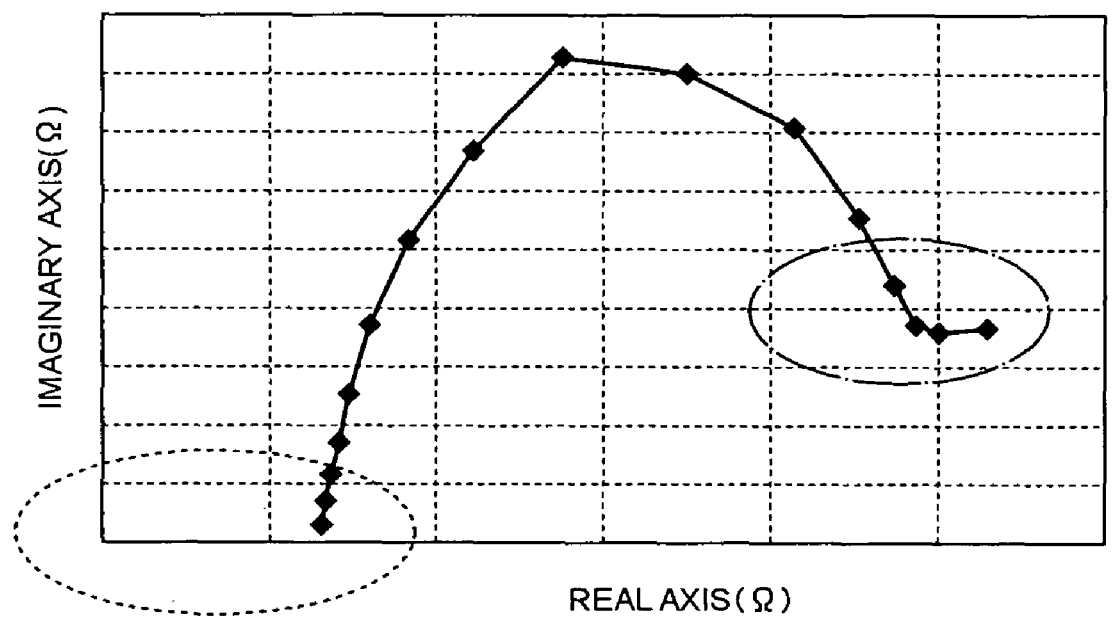
FIG. 2 is a diagram showing a result of impedance measurement according to the embodiment.

FIG. 2 is a diagram showing a result of impedance measurement by an alternating-current impedance process in a complex plane.

When internal impedances of the fuel cell at frequencies are measured on predetermined conditions and a track of an impedance accompanying a frequency change is plotted (Cole-Cole plot) on the complex plane, an impedance curve is obtained as shown in FIG. 2. Here, an impedance of a high frequency region shown by a dotted line and an impedance of a low frequency region shown by a one-dot chain line in FIG. 2 are information plainly indicating characteristics of the fuel cell 20, respectively. In the present embodiment, the impedance of the high frequency region and the impedance of the low frequency region are measured, and an internal state of the fuel cell 20 is estimated using this measurement result and system parameters (parameters concerned with the internal state of the fuel cell; described later) which subsidize this result, whereby an optimum operation of the fuel cell 20 is realized.

Figure 3:
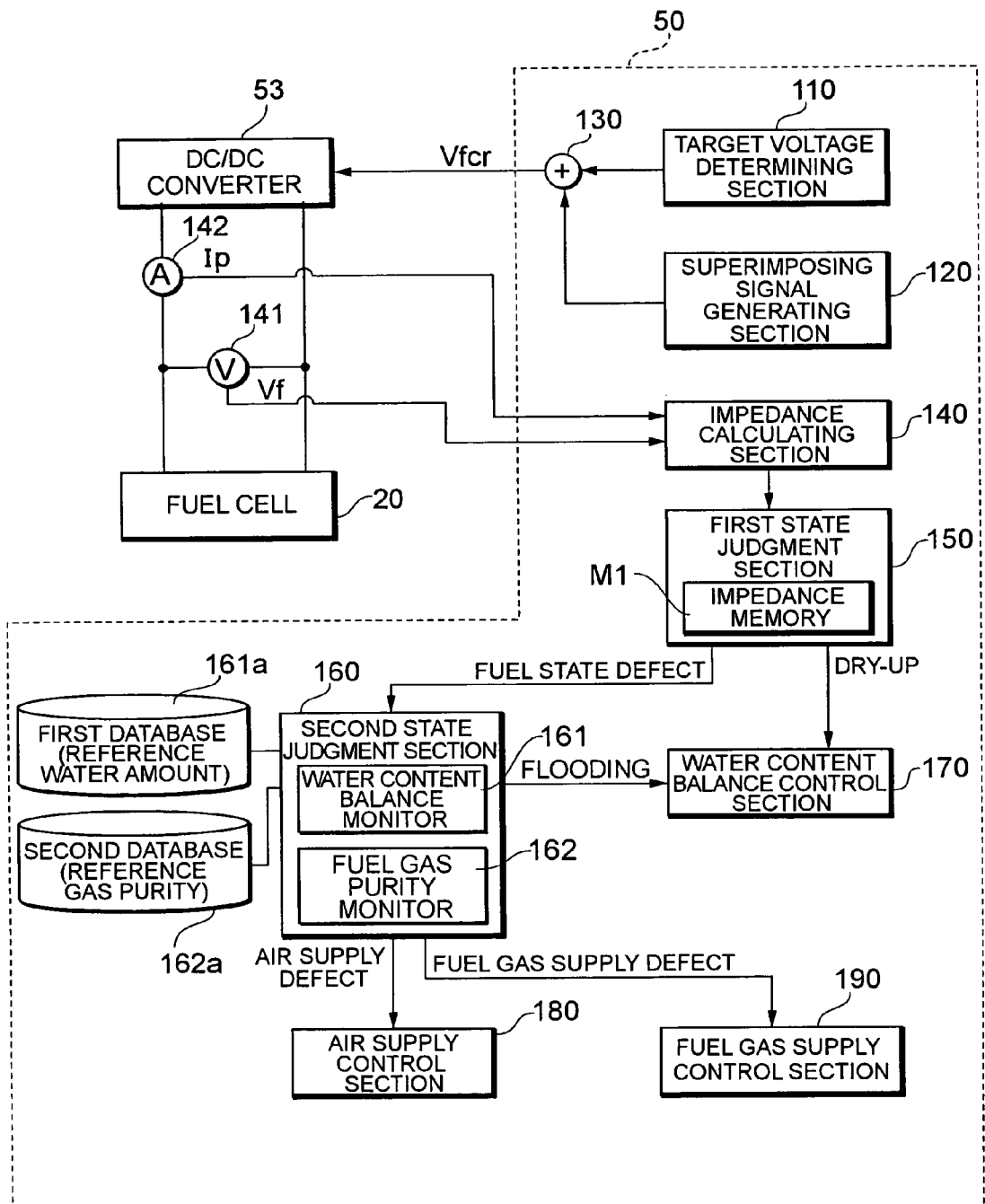
FIG. 3 is a functional block diagram showing the impedance measurement according to the embodiment.

FIG. 3 is a function block diagram showing impedance measurement.

As shown in FIG. 3, the control unit 50 includes a target voltage determining section 110, a superimposing signal generating section 120, a voltage instruction signal generating section 130, an impedance calculating section 140, a first state judgment section 150, a second state judgment section 160, a water content balance control section 170, an air supply control section 180 and a fuel gas supply control section 190.

The target voltage determining section 110 determines an output target voltage (e.g., 300 V or the like) based on the respective sensor signals input from an accelerator pedal sensor (not shown), the SOC sensor 21 and the like to output this voltage to the voltage instruction signal generating section 130.

The superimposing signal generating section 120 generates a signal for impedance measurement (e.g., a sine wave at a predetermined frequency and with an amplitude value of 2 V or the like) which is to be superimposed on the output target voltage to output this signal to the voltage instruction signal generating section 130. The amplitude value of this signal for impedance measurement is appropriately changed (e.g., an amplitude value 2 V→4 V, etc.) by a superimposing signal amplitude control section (not shown). It is to be noted that parameters (a type of a waveform, a frequency and an amplitude value) of the output target voltage and the signal for impedance measurement may appropriately be set in accordance with system design and the like.

The voltage instruction signal generating section 130 superimposes the signal for impedance measurement on the output target voltage to output a voltage instruction signal Vfcr to the DC/DC converter 53. The DC/DC converter 53 controls the voltage of the fuel cell 20 or the like based on the applied voltage instruction signal Vfcr.

The impedance calculating section 140 samples a voltage (FC voltage) Vf of the fuel cell 20 which is detected by a voltage sensor 141 and a current (FC current) If of the fuel cell 20 which is detected by a current sensor 142 at a predetermined sampling rate to perform Fourier transform processing (FFT calculation processing and DFT calculation processing) and the like. The impedance calculating section (measurement means) 140 divides an FC voltage signal subjected to the Fourier conversion processing by an FC current signal subjected to the Fourier conversion processing to obtain the impedance of the fuel cell 20, and then extracts an impedance measured value of the low frequency region and an impedance measured value of the high frequency region to output the values to the first state judgment section 150.

Here, a low frequency is a frequency of, for example, about 0.1 to 10 Hz, and a fuel supply state of the fuel cell 20 to an electrolytic film can be judged in accordance with the impedance measured value of such a low frequency region (details will be described later). On the other hand, a high frequency is a frequency of, for example, about 250 to 500 Hz, and a wet state of the electrolytic film of the fuel cell 20 can be judged in accordance with the impedance measured value of such a high frequency region (details will be described later). It is to be noted that the frequencies for use in the impedance measurement are not limited to the above-mentioned frequencies, and the frequency to be employed is arbitrary.

The first state judgment section (first judgment means) 150 is means for judging an outline of the internal state of the fuel cell 20, and includes an impedance memory M1. In the impedance memory M1, a plurality of types of impedance curves obtained by an experiment and the like under various conditions are stored. Specifically, in the impedance memory M1, there are stored impedance curves at a time when changing parameters such as a temperature of the fuel cell 20, a load state of the fuel cell 20, a state of the electrolytic film of the fuel cell 20 and an excessive ratio of a supplied gas.

On receiving the impedance measured values in the frequency regions from the impedance calculating section 140, the first state judgment section 150 first extracts, from the impedance memory M1, the impedance curve most adapted to the conditions of the impedance measurement at the corresponding time based on detection results obtained from the temperature sensor T1, the pressure sensor P1 and the like. Moreover, the first state judgment section 150 compares with the impedance measured value in each frequency region with the extracted impedance curve to judge the outline of the internal state of the fuel cell 20.

FIG. 4 is an explanatory view for judging the outline of the internal state of the fuel cell 20.

First, the first state judgment section 150 judges whether or not the impedance measured value of the low frequency region (hereinafter referred to as the low frequency impedance) is less than a first impedance threshold value on the impedance curve. When the low frequency impedance is the first impedance threshold value or less, it is judged that the low frequency impedance is "small". On the other hand, when the low frequency impedance is larger than the first impedance threshold value, it is judged that the low frequency impedance is "large".

Similarly, the first state judgment section 150 judges whether or not the impedance measured value of the high frequency region (hereinafter referred to as the high frequency impedance) is less than a second impedance threshold value on the impedance curve. When the high frequency impedance is the second impedance threshold value or less, it is judged that the high frequency impedance is "small". On the other hand, when the high frequency impedance is larger than the second impedance threshold value, it is judged that the high frequency impedance is "large".

The first state judgment section 150 combines these judgment results to judge the outside of the internal state of the fuel cell 20 as shown in FIG. 4 and as described hereinafter.

(1) "low frequency impedance; small" and "high frequency impedance; small"→satisfactory (state A)

(2) "low frequency impedance; large" and "high frequency impedance; small"→fuel state defect (state B)

(3) "low frequency impedance; small" and "high frequency impedance; large"→dry-up (state C)

(4) "low frequency impedance; large" and "high frequency impedance; large"→dry-up and fuel state defect (state D)

Here, the state A means that both of the wet state of the electrolytic film of the fuel cell 20 and the supply state of the fuel gas to the fuel cell 20 are satisfactory, the state B means that the supply state of the fuel gas to the fuel cell 20 is defective (the fuel state defect, the state C means that the wet state of the electrolytic film is defective (dry-up), and the state D means that the wet state of the electrolytic film is defective (dry-up) and means the fuel state defect.

In a case where the first state judgment section 150 judges the fuel state defect (the state B or D), the section notifies the second state judgment section 160 of the effect. On the other hand, when the dry-up (the state C or D) is judged, the section notifies the water content balance control section 170 of the effect.

In a case where the first state judgment section 150 judges that the fuel cell has the fuel state defect, the second state judgment section (second judgment means) 160 judges a factor for the defect (i.e., details of the internal state of the fuel cell 20). This will be described in detail. On receiving the notification indicating that the fuel cell has the fuel state defect from the first state judgment section 150, the details of the internal state of the fuel cell 20 will be judged using a water content balance monitor 161 and a fuel gas purity monitor 162.

<Water Content Balance Monitor>

The water content balance monitor (first detection means) 161 is means for detecting the water content state in the fuel cell, and obtains a residual water amount in the fuel cell by use of the following equation (A), and compares the obtained remaining water amount with a reference water amount (described later) to judge whether the water amount (water content state) in the fuel cell is excessive or normal.

$$Wre = Wco + Whu - Weo - Weh \qquad (A),$$

Wre; a residual water amount in the fuel cell;

Wco; an amount of water to be generated by power generation of the fuel cell;

Whu; an amount of humidification by the humidification module;

Weo; an amount of water to be carried away by the exhaust gas (the cathode side) of the fuel cell; and Weh; an amount of water to be carried away by the exhaust gas (the anode side) of the fuel cell.

This will be described in detail. The water content balance monitor 161 obtains parameter values based on the temperature of the fuel cell 20 supplied from each sensor, a temperature of the exhaust gas, a gas flow rate, a humidification capability of the humidification module 62 and the like, and substitutes the obtained parameter values into the equation (A) to obtain the residual water amount Wre in the fuel cell. The water content balance monitor 161 compares the obtained residual water amount Wre with a reference water amount registered in a first database 161*a* to judge whether the water amount in the fuel cell is excessive or normal. Specifically, when the obtained residual water amount Wre is a reference water amount or less, it is judged that the water amount in the fuel cell is "normal". On the other hand, when the obtained residual water amount Wre is above the reference water amount, it is judged that the water amount in the fuel cell is "excessive" (see FIG. 5). It is to be noted that to secure detecting precision of the water content balance monitor 161, an integrated value of the water amount may be reset at a time when the impedance measured value reaches a predetermined value or another time.

<Fuel Gas Purity Monitor>

The fuel gas purity monitor (second detection means) 162 is means for detecting a fuel gas purity in the fuel cell, and obtains the fuel gas purity in the fuel cell by use of the following equation (B), and compares the obtained fuel gas purity with a reference gas purity (described later) to judge whether the fuel gas purity in the fuel cell is high or low.

$$Gpr = 100 - Gea - Gsu + Gre \qquad (B),$$

Gpr; a fuel gas purity (%);

Gea; a concentration of an impurity gas in an initial state;

Gsu; a concentration of the impurity gas to be supplied from a fuel gas supply source; and Gre; a concentration of the impurity gas to be discharged from the purge valve.

This will be described in detail. The fuel gas purity monitor 162 substitutes impurity gas (nitrogen or the like) concentrations detected impurity gas concentration sensors (not shown) installed at the gas channels 31, 32 and the fuel cell 20 into the equation (B) to obtain the fuel gas purity Gpr in the fuel cell. Here, since the impurity gas concentration Gea in the initial state largely depends on a time when the fuel cell 20 is left to stand after stopped, the temperature of the fuel cell 20 and a pressure of the fuel gas, these parameter values may be obtained using the timer TM, the temperature sensor T1, the pressure sensor P1 and the like to estimate the impurity gas concentration in consideration of these parameter values. The respective impurity gas concentrations may be obtained from the respective detected fuel gas concentrations by use of fuel gas concentration sensors instead of the impurity gas concentration sensors.

On obtaining the fuel gas purity Gpr, the fuel gas purity monitor 162 compares the obtained fuel gas purity Gpr with a reference gas purity registered in a second database 162*a* to judge whether the fuel gas purity in the fuel cell is high or low. Specifically, when the obtained fuel gas purity Gpr is the reference gas purity or less, it is judged that the fuel gas purity in the fuel cell is "low". On the other hand, when the obtained fuel gas purity Gpr is above the reference gas purity Gba, it is judged that the fuel gas purity in the fuel cell is "high" (see FIG. 5).

The second state judgment section 160 combines judgment results of the water content balance monitor 161 and the fuel gas purity monitor 162 described above to judge the details of the internal state of the fuel cell 20 as shown in FIG. 5 and as described hereinafter.

(5) "water content balance monitor; excessive" and "fuel gas purity monitor; low"→fuel gas supply defect and fuel reaching defect with respect to the electrolytic film due to the flooding (state E)

(6) "water content balance monitor; excessive" and "fuel gas purity monitor; high"→fuel reaching defect with respect to the electrolytic film due to the flooding (state F)

(7) "water content balance monitor; normal" and "fuel gas purity monitor; low"→fuel gas supply defect (state G)

(8) "water content balance monitor; normal" and "fuel gas purity monitor; high"→air supply defect (state H)

Here, the state E means that factors for the judgment of the fuel state defect (i.e., the supply state of the fuel gas is defective) by the first state judgment section 150 are the supply defect (supply abnormality) of the fuel gas and the fuel reaching defect (fuel reaching abnormality) with respect to the electrolytic film due to the flooding, the state F means that the factor is the fuel reaching defect (fuel reaching abnormality) with respect to the electrolytic film due to the flooding, the state G means that the factor is the supply defect (supply abnormality) of the fuel gas, and the state H means that the factor is the supply defect (supply abnormality) of air (the oxidizing gas).

In a case where the second state judgment section 160 judges the air supply defect (the state H), this effect is notified to the air supply control section 180. On the other hand, when the fuel gas supply defect (the state E or G) is judged, this effect is notified to the fuel gas supply control section 190. Furthermore, when the second state judgment section 160 judges the fuel reaching defect (the state E or F) with respect to the electrolytic film due to the flooding, the effect is notified to the water content balance control section 170.

On receiving the notification of the air supply defect from the second state judgment section 160, the air supply control section (oxidizing gas supply control means) 180 performs such control as to raise an air stoichiometric ratio by use of an air stoichiometric ratio map (not shown), or limit an output of the fuel cell 20 to thereby increase a relative fuel gas supply amount with respect to an amount of power to be generated. When such control is performed, the air supply defect is eliminated, and the fuel cell system 10 returns to a normal operation state.

On receiving the notification of the fuel gas supply defect from the second state judgment section 160, the fuel gas supply control section (fuel gas supply control means) 190 performs such control as to raise a fuel gas air stoichiometric ratio by use of a fuel gas stoichiometric ratio map (not shown), or enlarge an open degree of the purge valve H51 other than to increase a purge amount of the fuel gas, or limit the output of the fuel cell 20 to thereby increase the relative fuel gas supply amount with respect to the amount of the power to be generated. When such control is performed, the fuel gas supply defect is eliminated, and the fuel cell system 10 returns to the normal operation state.

On receiving the notification of the dry-up from the first state judgment section 150 or receiving the notification of the fuel reaching defect with respect to the electrolytic film due to the flooding from the second state judgment section 160, the water content balance control section (water content balance control means) 170 performs the following control.

On receiving the notification of the dry-up from the first state judgment section 150, in order to reduce the amount of the water to be carried away by the exhaust gas of the fuel cell 20, the fuel gas supply control section 190 performs such control as to lower a temperature of a refrigerant (water or the like) for cooling the fuel cell 20, reduce the above-mentioned air stoichiometric ratio, or regulate the pressure regulation valve A4 to thereby increase an air back pressure. Alternatively, the battery 54 may be charged from the fuel cell 20 to increase the amount of the water to be produced by the fuel cell 20. When such control is performed, the dry-up is eliminated, and the fuel cell system 10 returns to the normal operation state.

On the other hand, on receiving the notification of the fuel reaching defect with respect to the electrolytic film due to the flooding from the first state judgment section 150, in order to increase the above-mentioned amount of the water to be carried away, the fuel gas supply control section 190 performs such control as to raise the temperature of the refrigerant of the fuel cell 20, increase the above-mentioned air stoichiometric ratio, or regulate the pressure regulation valve A4 to thereby reduce the air back pressure. Alternatively, such control may be performed as to limit the output of the fuel cell 20 to thereby reduce the amount of the water to be produced, increase the above-mentioned fuel gas air stoichiometric ratio, or enlarge the open degree of the purge valve H51 or the like to thereby increase the purge amount of the fuel gas. When such control is performed, the fuel reaching defect with respect to the electrolytic film due to the flooding is eliminated, and the fuel cell system 10 returns to the normal operation state.

As described above, according to the present embodiment, in order to grasp the internal state of the fuel cell, two or more types of impedances (the impedance of the high frequency region and the impedance of the low frequency region) are measured, and the system parameters (the internal water amount of the fuel cell, the fuel gas purity, etc.) which subsidize the measurement are also measured. When such measurement results are used, as compared with the conventional technology, the internal state of the fuel cell can accurately be grasped, and highly efficient and highly robust control of the fuel cell system can be achieved.

Moreover, in the system shown in FIG. 3, by the above-mentioned method, the signal for impedance measurement is superimposed on the output of the fuel cell, but according to the present invention, the grasping of the state of the fuel cell is realized using two or more types of impedance measured values, and hence the present invention is not limited to the above-mentioned constitution. For example, a device capable of fluctuating a load at a high frequency is connected to an output end of the fuel cell, whereby the superimposing of the signal for impedance measurement may be realized. Furthermore, a device capable of individually measuring the impedance is connected to the system, whereby a constitution in which a system control device (the control unit 50) can receive the impedance measured value may be employed.

The invention claimed is:

1. A fuel cell system comprising:
   a fuel cell;
   measurement means for measuring impedances of the fuel cell in two kinds or more of frequency regions including a low frequency region and a high frequency region; and
   first judgment means for judging two or more parameters including a supply state of a fuel gas with respect to the fuel cell and a wet state of an electrolytic film of the fuel cell and concerned with an internal state of the fuel cell based on measurement results of the impedances in the respective frequency regions, first detection means for detecting a water content state in the fuel cell;

second detection means for detecting a fuel gas purity in the fuel cell; and second judgment means programmed to judge a factor for a defect based on detection results of the respective detection means in a case where the first judgment means judges that the supply state of the fuel gas is defective, wherein the measurement means measures the impedance in the low frequency region and the impedance in the high frequency region, wherein the first judgment means is programmed to judge the supply state of the fuel gas with respect to the fuel cell and the wet state of the electrolytic film of the fuel cell based on a combination of the measurement result of the impedance in the low frequency region and the measurement result of the impedance in the high frequency region, and wherein the second judgment means is programmed to judge based on a combination of the detection results of the respective detection means whether the factor for the defect is a supply abnormality of the fuel gas, a supply abnormality of an oxidizing gas or a fuel reaching abnormality due to flooding.

2. The fuel cell system according to claim 1, wherein in the first judgment means, a first impedance threshold value to judge whether the supply state of the fuel gas is satisfactory or defective and a second impedance threshold value to judge whether the wet state of the electrolytic film is satisfactory or defective are set, the first judgment means judges that the supply state of the fuel gas is defective in a case where the measurement result of the impedance in the low frequency region is larger than the first impedance threshold value, and the first judgment means judges that the wet state of the electrolytic film is defective in a case where the measurement result of the impedance in the high frequency region is larger than the second impedance threshold value.

3. The fuel cell system according to claim 1, wherein the first detection means detects whether the water content state is normal or excessive, the second detection means detects whether the fuel gas purity is low or high, the second judgment means judges that the factor for the defect is the fuel reaching abnormality due to the flooding in a case where the first detection means judges that the water content state is excessive, the second judgment means judges that the factor for the defect is the supply abnormality of the fuel gas in a case where the second detection means judges that the fuel gas purity is low, and the second judgment means judges that the factor for the defect is the supply abnormality of the oxidizing gas in a case where the second detection means judges that the fuel gas purity is high.

4. The fuel cell system according to claim 3, which further comprises:

oxidizing gas supply control means for increasing an amount of the oxidizing gas to be supplied to eliminate the defect in a case where the second judgment means judges that the factor for the defect is the supply abnormality of the oxidizing gas.

5. The fuel cell system according to claim 3, which further comprises:

fuel gas supply control means for increasing an amount of the fuel gas to be supplied to eliminate the defect in a case where the second judgment means judges that the factor for the defect is the supply abnormality of the fuel gas.

6. The fuel cell system according to claim 3, which further comprises:

water content balance control means for increasing an amount of water to be carried away by an exhaust gas from the fuel cell in a case where the second judgment means judges that the factor for the defect is the fuel reaching abnormality due to the flooding.

7. The fuel cell system according to claim 1, wherein the second judgment means does not make the judgment in a case where the first judgment means judges that the supply state of the fuel gas is normal.

* * * * *